US006407906B1

United States Patent
Ahiko et al.

(10) Patent No.: US 6,407,906 B1
(45) Date of Patent: Jun. 18, 2002

(54) MULTITERMINAL-MULTILAYER CERAMIC CAPACITOR

(75) Inventors: Taisuke Ahiko, Akita-ken; Masaaki Togashi, Tokyo, both of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/611,311

(22) Filed: Jul. 6, 2000

(30) Foreign Application Priority Data

Dec. 6, 1999 (JP) .......................................... 11-345582

(51) Int. Cl.$^7$ ............................................. H01G 4/228
(52) U.S. Cl. .............................. 361/306.1; 361/306.1; 361/306.2; 361/303; 361/311
(58) Field of Search .......................... 361/306.1, 306.2, 361/306.3, 303, 313, 321.2, 301.4, 309, 310

(56) References Cited

U.S. PATENT DOCUMENTS

| | | | | |
|---|---|---|---|---|
| 5,369,545 A | * | 11/1994 | Bhattacharyya et al. | 361/306.2 |
| 5,405,466 A | * | 4/1995 | Natio et al. | 156/89 |
| 5,880,925 A | * | 3/1999 | dePreé et al. | 361/303 |
| 6,011,683 A | * | 1/2000 | Dat | 361/306.1 |
| 6,061,227 A | * | 5/2000 | Nogi | 361/303 |
| 6,071,800 A | * | 6/2000 | Shigemoto et al. | 438/612 |
| 6,072,687 A | * | 6/2000 | Naito et al. | 361/303 |

FOREIGN PATENT DOCUMENTS

| | | |
|---|---|---|
| JP | 7-161568 | 6/1995 |
| JP | 7-169649 | 7/1995 |
| JP | 8-124800 | 5/1996 |
| JP | 2657953 | 6/1997 |

* cited by examiner

Primary Examiner—Dean A. Reichard
Assistant Examiner—Nguyen Ha
(74) Attorney, Agent, or Firm—Oliff & Berridge, PLC

(57) ABSTRACT

A multiterminal multilayer ceramic capacitor having a capacitor body comprised of first internal electrodes and second internal electrodes alternately stacked via ceramic layers. Each first internal electrode has a first main portion positioned at the center of a first face of a ceramic layer and a plurality of first leads extending from the sides of the first main portion to the sides of the ceramic layer. Each second internal electrode has a second main portion which is opposite to the first main portion of the first internal electrode across the ceramic layer and which is arranged in a second face of the ceramic layer opposite to the first face to have the same shape as the first main portion and a plurality of leads extending to the sides of the ceramic layer from the sides of the second main portion at positions different from the first leads provided at the first internal electrodes. The side faces of the capacitor body are formed with first external electrodes electrically connected respectively to first leads positioned in the same line along the stacking direction of the ceramic layers and second external electrodes formed alternately with the first external electrodes and electrically connected respectively to second leads positioned in the same line along the stacking direction of the ceramic layers. The top pads are formed so as to continue from the top ends of the first external electrodes and extend to the top face of the capacitor body, and the bottom pads are formed so as to continue from the bottom ends of the second external electrodes and extend to the bottom face of the capacitor body.

15 Claims, 5 Drawing Sheets

MULTITERMINAL-MULTILAYER CERAMIC CAPACITOR

BACKGROUND OF THE INVENTION

1. Field of the Invention

The present invention relates to a multiterminal multilayer ceramic capacitor that is suitable for mounting in a personal computer or other electronic apparatus with a high operating frequency, suitable for surface mounting on a three-dimensional multilayer printed circuit board, and is a low equivalent serial inductance (ESL) and low equivalent serial resistance (ESR) capacitor.

2. Description of the Related Art

In the past, as multiterminal multilayer ceramic capacitors, the capacitor disclosed in U.S. Pat. No. 5,880,925 is known. This capacitor has a capacitor body which has two types of, that is, first and second, internal electrodes and dielectric layers stacked and sandwiched between them. Each of these internal electrodes is formed with a rectangular main portion pattern extending in the longitudinal direction on a face of a rectangular ceramic layer and a plurality of lead patterns extending from the sides of the main portion to the sides of the ceramic layer. The lead patterns of the first internal electrodes and the lead patterns of the second internal electrodes are formed at different positions from each other when seen from a plan view. A plurality of external electrodes are formed at the side faces of the long and short sides of the capacitor body of this multiterminal multilayer ceramic capacitor.

This multiterminal multilayer ceramic capacitor is placed on the surface of a circuit board so that the external electrodes are positioned in a standing direction from the surface of the circuit board. The internal electrodes and the stacking direction of the ceramic layers are substantially vertical to the circuit board. The external electrodes are connected and fixed by soldering to the lands of the circuit pattern of the circuit board so as to mount the capacitor on the surface of the circuit board.

In this multilayer ceramic capacitor, each of the internal electrodes extends thinly in the longitudinal direction of a ceramic layer from one external electrode to another external electrode. There is a long length of overlap of adjoining internal electrodes separated by ceramic layers. Therefore, the inductance component of the capacitor becomes large. Further, the distance between external electrodes facing each other along the longitudinal direction of the capacitor becomes long, so that the circuit pattern forming the circuit board becomes longer and therefore the detouring of the lands becomes longer. This has a detrimental effect on the inductance component.

In addition, in the above multiterminal multilayer ceramic capacitor, since the external electrodes are not provided at the corners of the capacitor body, if supplying reverse voltages to adjoining external terminals, short-circuits sometimes occur at the corners. Further, there is not much space for lead-in below capacitor devices in the design of the lands of the circuit board, mounting discrepancies of the capacitor device are apt to occur at the time of mounting the capacitor.

In personal computers and other electronic apparatuses, however, the operating frequency has increased from 500 MHz to 1 GHz. The power supply circuit requires a low ESL and low ESR multiterminal multilayer ceramic capacitor able to be reliably mounted on a three-dimensional printed circuit board etc. and giving predetermined characteristics.

In the above multiterminal multilayer ceramic capacitor, however, if three-dimensionally mounted on a three-dimensional multilayer printed circuit board etc., the circuit pattern formed on the circuit board becomes longer, the detouring of the lands becomes longer, and there is a detrimental effect on the inductance component. In particular, a circuit pattern comprised of lands at upper positions and lands at lower positions becomes longer, the detouring of the lands becomes longer and has a detrimental effect on the inductance component, and generation of noise becomes unavoidable.

Further, in the above multiterminal multilayer ceramic capacitor, the solder is formed at the external electrodes provided at the side faces of the capacitor body for connection to the lands of the circuit board, the solder formed at adjoining external electrodes easily contact each other and therefore short-circuits easily occur. Further, the conventional multiterminal multilayer ceramic capacitor was not structured suitably for connection to three-dimensionally arranged circuit boards.

Note that as shown in Japanese Unexamined Patent Publication (Kokai) No. 7-169649, Japanese Unexamined Patent Publication (Kokai) No. 7-161568, and Japanese Unexamined Patent Publication (Kokai) No. 8-124800, capacitor arrays of a rectangular or square shape when seen from a plan view have been proposed. These capacitor arrays, however, are made for reducing the crosstalk of capacitive coupling. In these capacitor arrays, while the ends of the external electrodes formed at the side faces of the capacitor body have portions extending out to the top face and bottom face of the capacitor body, the nearby external electrodes similarly extend to the top face and bottom face covering an equal area. Therefore, the structure has not been suited to connection to three-dimensionally arranged circuit boards.

Further, the multilayer capacitor disclosed in Japanese Patent. No. 2657953 is also disclosed. In this capacitor, however, since the external terminals are formed on only the top face and/or bottom face of the capacitor body and external terminals are not formed on the side faces, the external terminals end up being densely concentrated at the top face and/or bottom face of the body. To avoid short-circuits between terminals, the planar area of the body has to be increased.

SUMMARY OF THE INVENTION

An object of the present invention is to provide a compact, thin, three-dimensionally mountable multiterminal multilayer ceramic capacitor suitable for mounting in an electronic apparatus with a high operating frequency and suitable for surface mounting on a three-dimensional multilayer printed circuit board, which is a low ESL and low ESR capacitor.

To achieve the object, the multiterminal multilayer ceramic capacitor according to a first aspect of the present invention comprises a ceramic layer; a first internal electrode having a first main portion positioned at the center in a first face of the ceramic layer and having a plurality of first leads extending from sides of the first main portion to sides of the ceramic layer; a second internal electrode having a second main portion which is opposite to the first main portion of the first internal electrode across the ceramic layer and which is arranged in a second face of the ceramic layer opposite to the first face to have the same shape as the first main portion and having a plurality of second leads extending to the sides of the ceramic layer from sides of the second main portion at positions different from the first leads provided at the first internal electrode; first external electrodes formed at side faces of a capacitor body comprised of a plurality of first internal electrodes and second internal electrodes stacked via ceramic layers and electrically connected respectively to the first leads positioned in the same line along a stacking direction of the ceramic layers; second external electrodes alternately formed with respect to the first external electrodes at the side faces of the capacitor body and electrically connected respectively to the second leads positioned in the same line along a stacking direction of the ceramic layers; top pads continuing from top ends of the first external electrodes and extending to a top face of the capacitor body; and bottom pads continuing from bottom ends of the second external terminals and extending to a bottom face of the capacitor body.

The bottom ends of the first external electrodes either do not extend much to the bottom face of the capacitor body or else even if extending are smaller in area than the bottom pads of the second external electrodes. Further, the top ends of the second external electrodes either do not extend much to the top face of the capacitor body or else even if extending are smaller in area than the top pads of the first external electrodes.

Preferably, the first internal electrode is formed with first corner leads extending from corners of the first main portion along the ceramic layer to first corners of the capacitor body; the second internal electrode is formed with second corner leads extending from corners of the second main portion along the ceramic layer to second corners of the capacitor body; first corner external electrodes are formed at the first corners of the capacitor so as to electrically connect to the first corner leads; second corner external electrodes are formed at the second corners of the capacitor so as to electrically connect to the second corner leads; top pads are formed continuing from top ends of the first corner external electrodes and extending to a top face of the capacitor body; and bottom pads are formed continuing from bottom ends of the second corner external electrodes and extending to a bottom face of the capacitor body.

Alternatively, the first internal electrode is formed with first corner leads extending from corners of the first main portion along the ceramic layer to first corners of the capacitor body; first corner external electrodes are formed at the first corners of the capacitor body so as to be electrically connected to the first corner leads; top pads are formed continuing from top ends of the first corner external electrodes and extending to the top face of the capacitor body; and corner leads are not formed at the second internal electrode.

Alternatively, the second internal electrode is formed with second corner leads extending from corners of the second main portion along the ceramic layer to second corners of the capacitor body; second corner external electrodes are formed at the second corners of the capacitor body so as to be electrically connected to the second corner leads; bottom pads are formed continuing from bottom ends of the second corner external electrodes and extending to the bottom face of the capacitor body; and corner leads are not formed at the first internal electrode.

Preferably, the first external electrodes (below, including first corner external electrodes) are connected to a first circuit pattern outside of the capacitor body and the second external electrodes (below, including second corner external electrodes) are connected to a second circuit pattern different from the first circuit pattern.

Preferably, the top pads of the first external electrodes are connected to a first circuit pattern of a top circuit board arranged outside the top of the capacitor body, and the bottom pads of the second external electrodes are connected to a second circuit pattern of a bottom circuit board arranged outside the bottom of the capacitor body.

The nearby external electrodes are for example supplied with voltages of reverse polarities. They may also be supplied with high frequency voltages.

Preferably, the ceramic layer is formed as a square, and the capacitor body is a square when seen from a plan view.

According to the multiterminal multilayer ceramic capacitor according to the present invention, since the distance between external electrodes can be set short, even if mounted on a multilayer board, the total inductance due to the detouring of the lands can be reduced and the lands formed on the multilayer board can be simplified. Further, by supplying voltages of reverse polarities to the nearby external electrodes, current flows uniformly to all of the capacitor body and the magnetic flux is uniformly canceled, so that the ESL can be reduced. As a result, it is possible to realize a low ESL and low ESR capacitor. The capacitor can be suitably used for mounting on a personal computer or other electronic apparatus with a high operating frequency. Further, the capacitor of the present invention is so compact and thin that it is suitable for mounting buried in a three-dimensional multilayer printed circuit board etc.

Further, in the present invention, by connecting the top pads of the first external electrodes to a first circuit pattern of a top circuit board arranged outside the top of the capacitor body and connecting the bottom pads of the second external electrodes to a second circuit pattern of a bottom circuit board arranged outside the bottom of the capacitor body, the capacitor is suitable for three-dimensional mounting. In particular, when only top pads of the first external electrodes are formed at the top face of the capacitor body and when only bottom pads of the second external electrodes are formed at the bottom face of the capacitor body, short-circuits of the first external electrodes and second external electrodes can be effectively prevented.

Further, when the first corner external electrodes and second corner external electrodes are formed at the corners of the capacitor body as well, even if reverse voltages are supplied to the nearby external electrodes, the problem of short-circuits does not arise at the corners. Further, since there is a large space for leading in the lands under the capacitor devices in the design of the lands of the circuit board, it is possible to effectively prevent discrepancies in mounting capacitor devices at the time of mounting.

The multiterminal multilayer ceramic capacitor according to the second aspect of the present invention comprises a ceramic layer; a first internal electrode having a first main portion positioned at the center in a first face of the ceramic layer and having a plurality of first leads extending from sides of the first main portion to sides of the ceramic layer; a second internal electrode having a second main portion which is opposite to the first main portion of the first internal electrode across the ceramic layer and which is arranged in a second face of the ceramic layer opposite to the first face to have the same shape as the first main portion and having a plurality of second leads extending to the sides of the ceramic layer from sides of the second main portion at positions different from the first leads provided at the first internal electrode; first external electrodes formed at side faces of a capacitor body comprised of a plurality of first internal electrodes and second internal electrodes stacked via ceramic layers and electrically connected respectively to the first leads positioned in the same line along a stacking direction of the ceramic layers; and second external electrodes alternately formed with respect to the first external electrodes at the side faces of the capacitor body and electrically connected respectively to the second leads positioned in the same line along the stacking direction of the ceramic layers; the first internal electrode being arranged exposed at a top face of the capacitor body and the second internal electrode being arranged exposed at a bottom face of the capacitor body.

In the multilayer ceramic capacitor according to the second aspect of the present invention, the first electrode itself positioned exposed at the top face of the capacitor body takes the place of the above top pads, while the second electrode itself positioned exposed at the bottom face of the capacitor body takes the place of the bottom pads. Therefore, in the present invention, it is possible to obtain a large area for the electrode pads, three-dimensional mounting of the capacitor becomes easier, and a lower ESL and lower ESR capacitor can be realized.

BRIEF DESCRIPTION OF THE DRAWINGS

These and other objects and features of the present invention will be explained in further detail with reference to the attached drawings, in which.

DESCRIPTION OF THE PREFERRED EMBODIMENTS

First Embodiment

Figure 1:
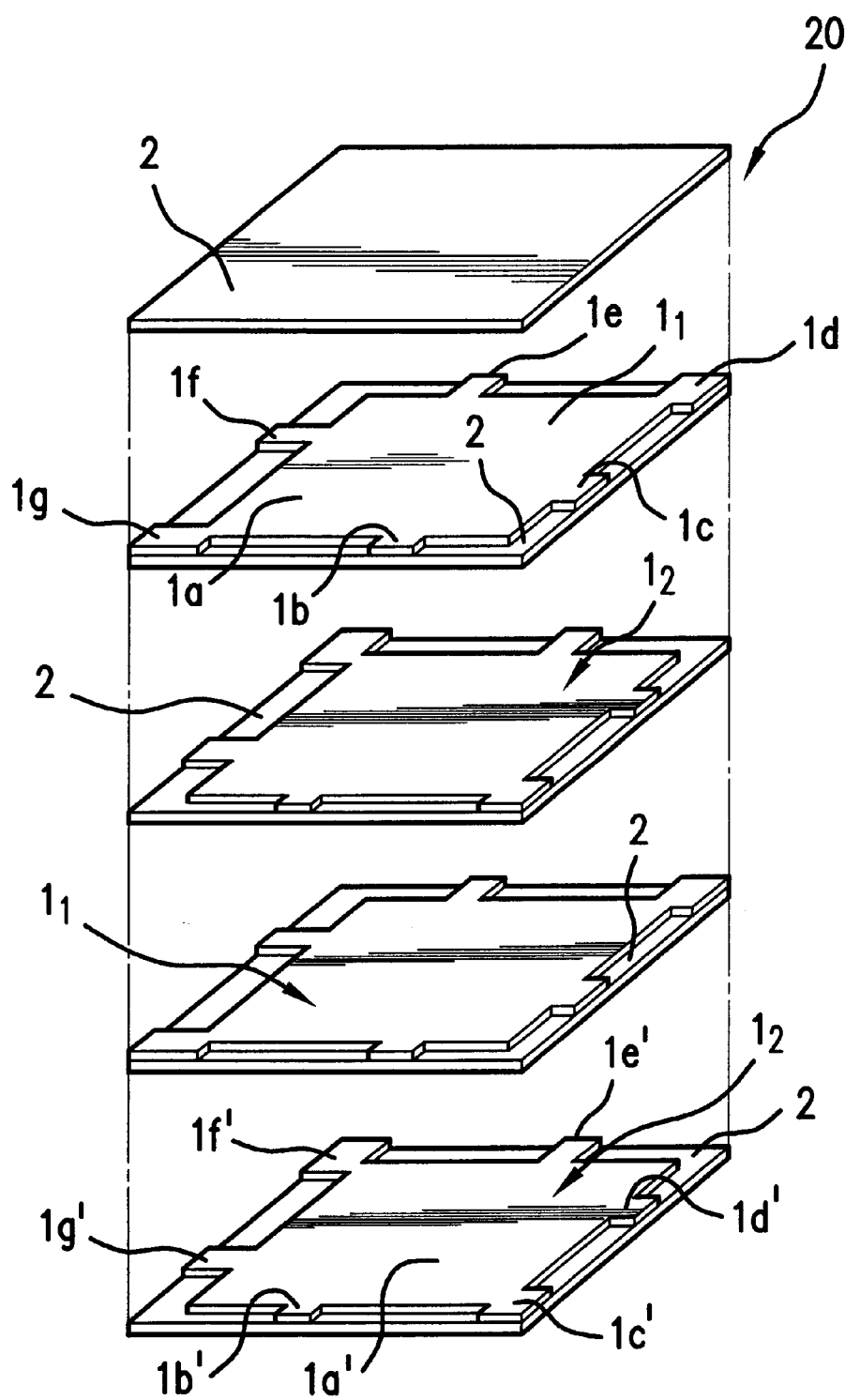
FIG. 1 is a disassembled perspective view of a capacitor body of a multiterminal multilayer ceramic capacitor according to an embodiment of the present invention.
Figure 2:
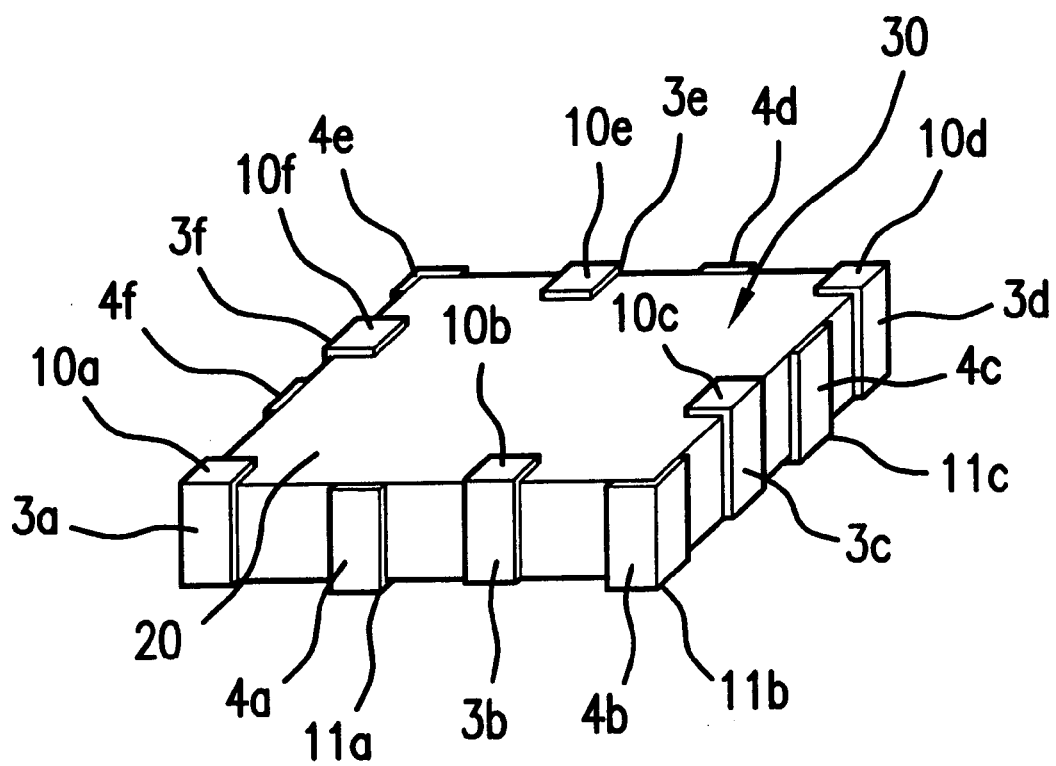
FIG. 2 is an overall perspective view of the multiterminal multilayer ceramic capacitor according to the embodiment of the present invention.

As shown in FIG. 1 and FIG. 2, the multiterminal multilayer ceramic capacitor 30 for three-dimensional mounting according to the present embodiment has a capacitor body 20 of a square shape seen from a plan view. The capacitor body 20, as shown in FIG. 1, is comprised of a plurality of first internal electrodes $1_1$ and second internal electrodes $1_2$ of predetermined patterns alternately stacked via ceramic layers 2 formed in square shapes. Note that at least one ceramic layer not formed with an internal electrode is stacked at the top and bottom of the body 20 in the stacking direction.

As shown in FIG. 1, each first internal electrode $1_1$ has a square first main portion 1a positioned at the center of a first face (surface) of the ceramic layer 2 and has a plurality of first leads 1b, 1c, 1e, and 1f extending from the sides of the first main portion 1a to the sides of the ceramic layer 2. Further, the first internal electrode $1_1$ is formed with first corner leads 1d and 1g extending from corners present at diagonal corners of the first main portion 1a along the ceramic layer 2 to first corners of the capacitor body 20.

Further, each second internal electrode $1_2$ has a second main portion 1a' of the same shape opposing to the first main portion 1a of the first internal electrode across a ceramic layer 2 in a rear surface (second face) opposite to the surface of the ceramic layer 2 and has a plurality of first leads 1b', 1c', 1e', and 1f' extending from the sides of the second main portion 1a' at positions different from the first leads 1b, 1c, 1e, and 1f to the sides of the ceramic layer 2. Further, the second internal electrode $1_2$ is formed with second corner leads 1c' and 1f' extending from corners present at diagonal corners of the second main portion 1a' along the ceramic layer 2 to second corners of the capacitor body 20.

As shown in FIG. 2, the four side faces of the capacitor body 20 are formed with first external electrodes 3b, 3c, 3e, and 3f electrically connected to first leads 1b, 1c, 1e, and 1f positioned respectively in the same line along the stacking direction of the ceramic layers 2. Further, the first corners forming diagonal corners of the capacitor body 2 are formed with first corner external electrodes 3d and 3a so as to be electrically connected to the first corner leads 1d and 1g.

Further, the four side faces of the capacitor body 20 are formed with second external electrodes 4a, 4c, 4d, and 4f electrically connected to second leads 1b', 1d', 1e', and 1f' positioned respectively in the same line along the stacking direction of the ceramic layers 2. Further, the second corners different from the first corners forming diagonal corners of the capacitor body 2 are formed with second corner external electrodes 4b and 4e so as to be electrically connected to the second corner leads 1c' and 1f'.

That is, as shown in FIG. 2, the first external electrodes (below, including corner electrodes) 3a to 3f and the second external electrodes 4a to 4f are arranged alternately at different locations along the outer circumference of the capacitor body 20. Further, the first external electrodes 3a to 3f are connected to the first internal electrodes $1_1$ of the layers through the first leads (below, including corner leads) 1b to 1g, while the second external electrodes 4a to 4f are connected to the second internal electrodes $1_2$ of the layers through the second leads 1b' to 1g'.

In the present embodiment, as shown in FIG. 2, top pads 10a to 10f are formed so as to continue from the top ends of the first external electrodes 3a to 3f and extending to the top face of the capacitor body 20, while bottom pads 11a, 11b, 11c . . . are formed continuing from the bottom ends of the second external electrodes 4a to 4f and extending to the bottom face of the capacitor body 20. Note that in FIG. 2, while the illustration of the bottom pads 11a, 11b, 11c . . . is omitted, they are the same in shape as the top pads 10a to 10f and differ only in the positions seen from the plan view. The area of these pads is not particularly limited so long as there is sufficient area for connection with the lands of the circuit boards etc.

In the present embodiment, as shown in FIG. 2, the second external electrodes 4a to 4f do not extend to the top face of the capacitor body, while the first external electrodes 3a to 3f do not extend to the bottom face of the capacitor body.

These internal electrodes $1_1$ and $1_2$ are formed by coating and baking an Ni or other conductive paste on the surface of a ceramic green sheet and are comprised of Ni or Ni alloy layers etc. Note that the internal electrodes may also be comprised of the base metal Cu, precious metal Pd or a Pd—Ag alloy layer etc.

The ceramic layer 2 is comprised of a barium titanate-based, titanium-based, zirconate-based, or other ceramic composition. A stack of the ceramic layers 2 and internal electrodes is formed by coating a ceramic paste on a base film or other film surface to make a green sheet, printing a conductive paste on it, then stacking, cutting, and firing the green sheets. After the production of the body 20, the external electrodes are formed and baked on. The external electrodes 3a to 3f and 4a to 4f specifically can be formed by coating, drying, and baking a Cu paste on the body to form an underlayer, then covering the underlayer with a Ni and Sn plating layer.

The multilayer ceramic capacitor 30 produced in this way is used for three-dimensional mounting of multiple terminals by electrically joining the external electrodes 3a to 3f and 4a to 4f to different circuit patterns of the circuit board and supplying voltages of different polarities to the nearby external electrodes.

The specific dimensions of the multiterminal multilayer ceramic capacitor of the present embodiment are not particularly limited, but for example are a height of 0.5±0.1 mm, a width of 3.2±0.1 mm, and a length of 3.2±0.1 mm. The thickness of one ceramic layer is not particularly limited, but is for example 4 μm. The shape of the ceramic layer is that of a square of sides of 3.2±0.1 mm.

Figure 4:
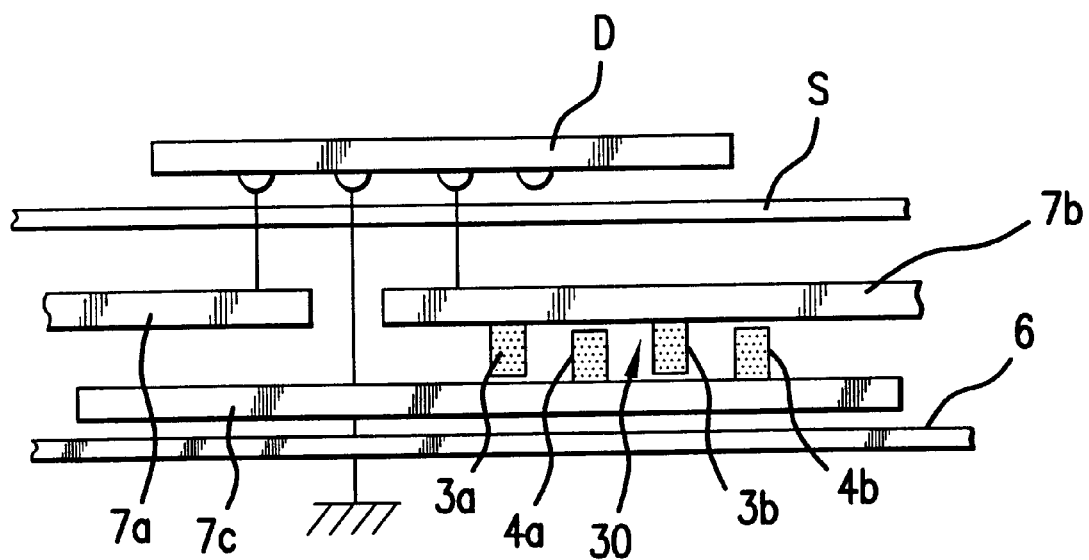
FIG. 4 is a side view of an example of use of the multiterminal multilayer ceramic capacitor according to the embodiment of the present invention.

The multiterminal multilayer ceramic capacitor 30 configured in this way, as shown in FIG. 4, may be mounted between the circuit boards 5 and 6 of the power supply circuit provided with the semiconductor device D. This three-dimensional mounting may be performed in the following way.

That is, the semiconductor device D is connected with the circuit patterns (or circuit boards) 7a and 7b by using of any of the terminals, the first external electrodes 3a, 3b . . . (some not illustrated) of the multilayer ceramic capacitor 30 are connected with one circuit pattern 7b, and the second external electrodes 4a, 4b . . . are grounded with another circuit pattern 7c, and these are electrically joined to +poles/−poles (GND).

In the present embodiment, by connecting the top pads 10a to 10f of the first external electrodes to the first circuit pattern 7b arranged outside the top of the capacitor 30 and connecting the bottom pads 11a . . . of the second external electrodes to the second circuit pattern arranged outside the bottom of the capacitor 30, the capacitor becomes suitable for three-dimensional mounting. In particular, since only the top pads 10a to 10f of the first external electrodes are formed on the top face of the capacitor body 20 and only the bottom pads 11a . . . are formed at the bottom face of the capacitor body 20, the phenomenon of short-circuits of the first external electrodes and second external electrodes can be effectively prevented.

Further, in the present embodiment, since the first corner external electrodes and the second corner external electrodes are formed at the corners of the capacitor body 20 as well, even if reverse voltages are supplied to the nearby external terminals, no problem of short-circuits at the corners occurs. Further, since a large area for leading in the lands under the capacitor devices can be secured in the design of the lands of the circuit boards 5 and 6, discrepancies in mounting the devices at the time of mounting can be prevented.

Further, in the multilayer ceramic capacitor of the present embodiment, since the capacitor as a whole is a square seen from the plan view and the distance between the nearby external electrodes at the sides can be set short, the detouring of the lands becomes shorter and the effect of the inductance component can be reduced. Further, since voltages of reverse polarities are supplied to the nearby external electrodes 3a, 3b, 4a, and 4b, the current flows uniformly to the capacitor device as a whole and the magnetic flux is also uniformly canceled out, so that the ESL can be reduced.

Further, the ESL value of the multilayer ceramic capacitor 30 of the present embodiment is a low 3 to 5 pH and the ESR value is a low 4 to 6 mΩ. By mounting the multilayer ceramic capacitor 30 on the circuit board 5, the inductance component of the lands can be ignored. Due to this, if comparing the ESL and ESR of the multiterminal multilayer ceramic capacitor according to the prior art and the multiterminal multilayer ceramic capacitor according to the present invention (same electrostatic capacity as the related art), the value is 8 percent for the multiterminal multilayer ceramic capacitor according to the prior art, while is a low 2 to 3 percent for the multiterminal multilayer ceramic capacitor according to the present embodiment.

This is because in the multiterminal multilayer ceramic capacitor according to the present embodiment, since the distance between the opposite external electrodes can be set short, even if the capacitor is mounted on a multilayer board, the total inductance due to the detouring of the lands can be reduced and the lands formed on the multilayer board can be simplified.

Second Embodiment

Figure 3:
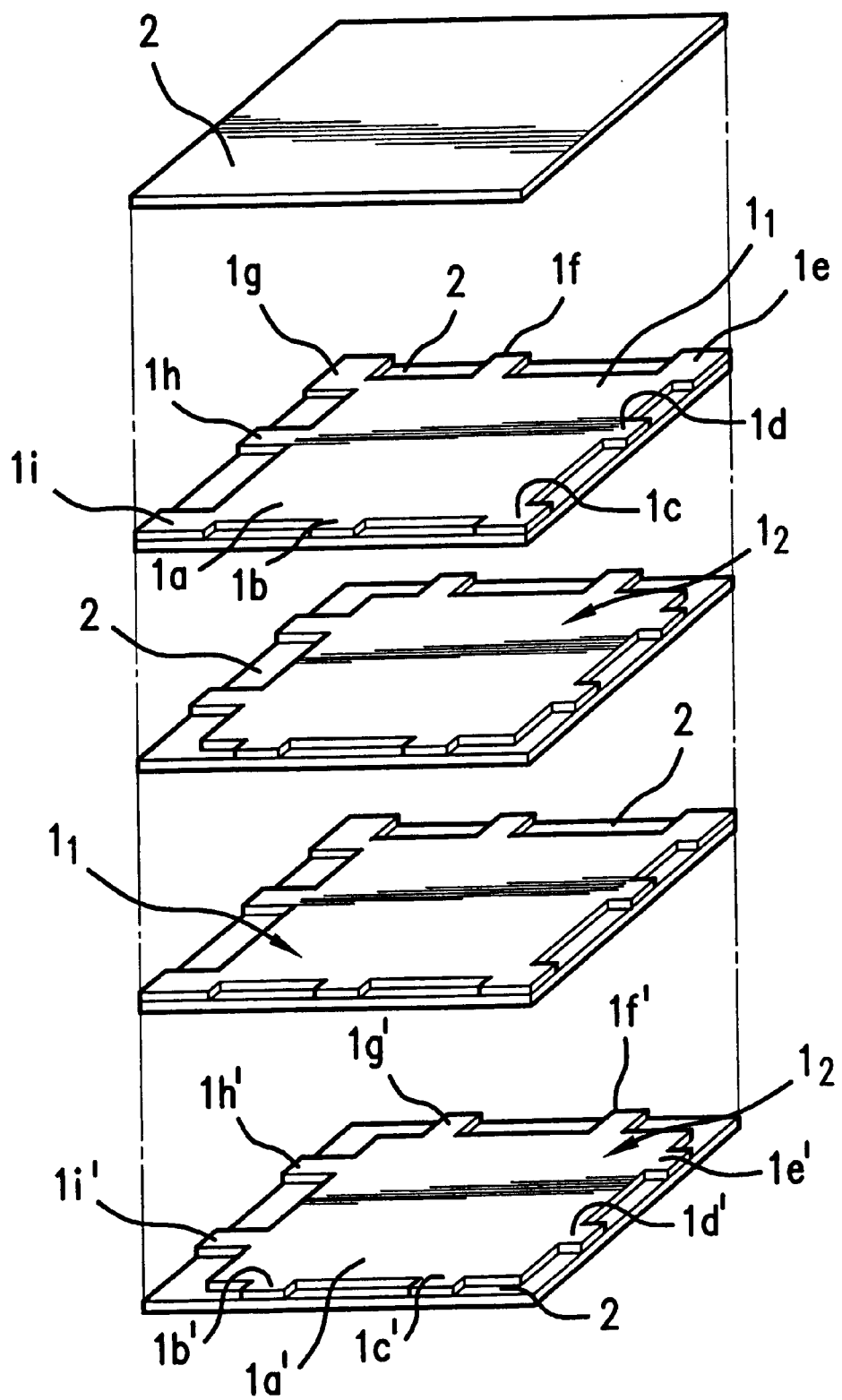
FIG. 3 is a disassembled perspective view of a capacitor body of a multiterminal multilayer ceramic capacitor according to another embodiment of the present invention.

As shown in FIG. 3, the multilayer ceramic capacitor of the present embodiment differs from the multilayer ceramic capacitor of the first embodiment in only the pattern of the internal electrodes and is the same in the rest of the configuration, so that the explanation of the common portions will be omitted.

In the present embodiment, other than the plurality of first leads 1b, 1d, 1f, and 1h extending from the sides of the first main portion 1a to the sides of the ceramic layer 2, the fist internal electrodes $1_1$ are formed with four corner leads 1c, 1e, 1g, and 1i extending from the four corners of the first main portion 1a to the four corners of the capacitor body 20.

Further, second internal electrodes $1_2$ are not formed with the corner leads, but are formed with only the plurality of second leads 1b' to 1i' extending from the sides of the second main portion 1a' to the sides of the ceramic layer 2.

In the case of this embodiment, the external electrodes arranged at the corners of the capacitor body are all first external electrodes, and the first external electrodes and second external electrodes are alternately arranged along the circumferential direction at the side surfaces of the capacitor body, including the corners.

Third Embodiment

Figure 5:
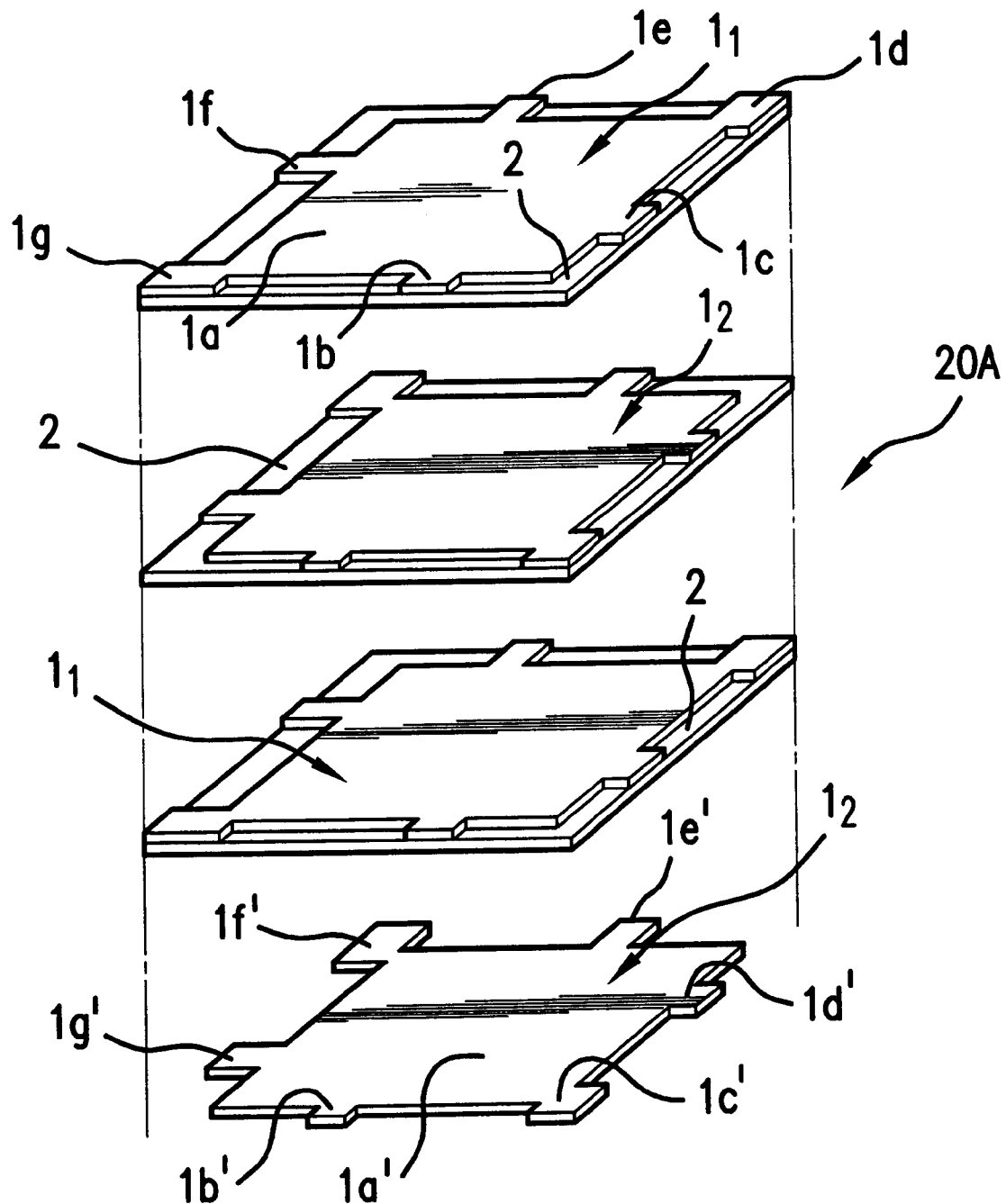
FIG. 5 is a disassembled perspective view of a capacitor body of a multiterminal multilayer ceramic capacitor according to another embodiment of the present invention.

As shown in FIG. 5, the multilayer ceramic capacitor of the present embodiment differs only in the multilayer structure of the ceramic layers 2 and the internal electrodes $1_1$ and $1_2$ compared with the multilayer ceramic capacitor of the first embodiment. The rest of the configuration is in common. Therefore, explanations of the common portions will be omitted.

In this embodiment, the electrodes and ceramic layers 2 are stacked so that a first internal electrode $1_1$ is positioned exposed at the top face of the capacitor body 20A, while a second internal electrodes $1_2$ is positioned exposed at the bottom face of the capacitor body 20A.

In the present embodiment, the first electrode itself positioned exposed at the top face of the body 20A takes the place of the above top pads 10a to 10f shown in FIG. 2, while the second electrode itself positioned exposed at the bottom face of the body 20A takes the place of the bottom pads 11a, 11b . . . shown in FIG. 2. Therefore, in the present embodiment, it is possible to obtain a large area for the electrode pads, three-dimensional mounting of the capacitor shown in FIG. 4 becomes easier, and a lower ESL and lower ESR capacitor can be realized.

Note that the present invention is not limited to the above-mentioned embodiments and may be changed in various ways within the scope of the present invention.

What is claimed is:

1. A multiterminal multilayer ceramic capacitor comprising:
   a ceramic layer;
   a first internal electrode having a first main portion positioned at the center in a first face of the ceramic layer and having a plurality of first leads extending from sides of the first main portion to sides of the ceramic layer;
   a second internal electrode having a second main portion, which is opposite to the first main portion of the first internal electrode across said ceramic layer and is arranged in a second face of the ceramic layer opposite to the first face to have a shape which is the same as a shape of the first main portion, and having a plurality of second leads extending to the sides of the ceramic layer from sides of the second main portion at positions different from the first leads provided at the first internal electrode;
   first external electrodes formed at side faces of a capacitor body comprised of a plurality of first internal electrodes and second internal electrodes stacked via ceramic layers and electrically connected respectively to the first leads positioned in the same line along a stacking direction of the ceramic layers;
   second external electrodes alternately formed with respect to the first external electrodes at the side faces of the capacitor body and electrically connected respectively to the second leads positioned in the same line along the stacking direction of the ceramic layers;
   top pads continuing from top ends of said first external electrodes, said first external electrodes extending only to a top face of said capacitor body; and
   bottom pads continuing from bottom ends of said second external electrodes, said second external electrodes extending only to a bottom face of said capacitor body.

2. The multiterminal multilayer ceramic capacitor as set forth in claim 1, wherein said first external electrodes are connected to a first circuit pattern outside of said capacitor body and said second external electrodes are connected to a second circuit pattern different from said first circuit pattern.

3. The multiterminal multilayer ceramic capacitor as set forth in claim 1, wherein the top pads of the first external electrodes are connected to a first circuit pattern of a top circuit board arranged outside the top of the capacitor body and the bottom pads of the second external electrodes are connected to a second circuit pattern of a bottom circuit board arranged outside the bottom of the capacitor body.

4. The multiterminal multilayer ceramic capacitor as set forth in claim 1, wherein adjoining first external electrodes and second external electrodes are supplied with voltages of reverse polarities.

5. The multiterminal multilayer ceramic capacitor as set forth in claim 1, wherein said ceramic layer is formed as a square and the capacitor body is a square when seen from a plan view.

6. The multiterminal multilayer ceramic capacitor as set forth in claim 1, wherein:
   the first internal electrode is formed with first corner leads extending from corners of the first main portion along the ceramic layer to first corners of the capacitor body;
   the second internal electrode is formed with second corner leads extending from corners of the second main portion along the ceramic layer to second corners of the capacitor body;
   first corner external electrodes are formed at the first corners of the capacitor so as to electrically connect to the first corner leads;
   second corner external electrodes are formed at the second corners of the capacitor so as to electrically connect to the second corner leads;
   top pads are formed continuing from top ends of the first corner external electrodes and extending to the top face of said capacitor body; and
   bottom pads are formed continuing from bottom ends of the second corner external electrodes and extending to the bottom face of said capacitor body.

7. The multiterminal multilayer ceramic capacitor as set forth in claim 6, wherein said first external electrodes and said first corner external electrodes are connected to a first circuit pattern outside the capacitor body and said second external electrodes and said second corner external electrodes are connected to a second circuit pattern different from the first circuit pattern.

8. The multiterminal multilayer ceramic capacitor as set forth in claim 6, wherein the top pads of the first external electrodes and the first corner external electrodes are connected to a first circuit pattern of a top circuit board arranged outside the top of the capacitor body, and the bottom pads of the second external electrodes and the second corner external electrodes are connected to a second circuit pattern of a bottom circuit board arranged outside the bottom of the capacitor body.

9. The multiterminal multilayer ceramic capacitor as set forth in claim 6, wherein the nearby external electrodes are supplied with voltages of reverse polarities.

10. The multiterminal multilayer ceramic capacitor as set forth in claim 1, wherein:
    the first internal electrode is formed with first corner leads extending from corners of the first main portion along the ceramic layer to first corners of said capacitor body;
    first corner external electrodes formed at the first corners of the capacitor body so as to be electrically connected to the first corner leads;
    top pads are formed continuing from top ends of the first corner external electrodes and extending to the top face of the capacitor body; and
    corner leads are not formed at the second internal electrode.

11. The multiterminal multilayer ceramic capacitor as set forth in claim 1, wherein:
    the second internal electrode is formed with second corner leads extending from corner of the second main portions along the ceramic layer to second corners of said capacitor body;
    second corner external electrodes are formed at the second corners of the capacitor body so as to be electrically connected to the second corner leads;
    bottom pads are formed continuing from bottom ends of the second corner external electrodes and extending to the bottom face of the capacitor body; and
    corner leads are not formed at the first internal electrode.

12. A multiterminal multilayer ceramic capacitor comprising:
    a ceramic layer;
    a first internal electrode having a first main portion positioned at the center in a first face of said ceramic layer and having a plurality of first leads extending from sides of the first main portion to sides of said ceramic layer;

a second internal electrode having a second main portion which is opposite to the first main portion of the first internal electrode across said ceramic layer and which is arranged in a second face of the ceramic layer opposite to the first face to have a shape which is the same as a shape of the first main portion and having a plurality of second leads extending to the sides of the ceramic layer from sides of the second main portion at positions different from the first leads provided at the first internal electrode;

first external electrodes formed at side faces of a capacitor body comprised of a plurality of first internal electrodes and second internal electrodes stacked via ceramic layers and electrically connected respectively to the first leads positioned in the same line along a stacking direction of the ceramic layers; and second external electrodes alternately formed with respect to the first external electrodes at the side faces of the capacitor body and electrically connected respectively to the second leads positioned in the same line along the stacking direction of the ceramic layers;

said first main portion of the first internal electrode being exposed only at a top face of the capacitor body and said second main portion of the second internal electrode being exposed only at a bottom face of the capacitor body.

13. The multiterminal multilayer ceramic capacitor as set forth in claim 12, wherein said first internal electrode formed on the top face of the capacitor body is connected to a first circuit pattern outside of said capacitor body and said second internal electrode formed on the bottom face of the capacitor body is connected to a second circuit pattern different from said first circuit pattern.

14. The multiterminal multilayer ceramic capacitor as set forth in claim 12, wherein the first internal electrode and second internal electrode are supplied with voltages of reverse polarities.

15. The multiterminal multilayer ceramic capacitor as set forth in claim 12, wherein said ceramic layer is formed as a square and the capacitor body is a square when seen from a plan view.

* * * * *